Figure 1:
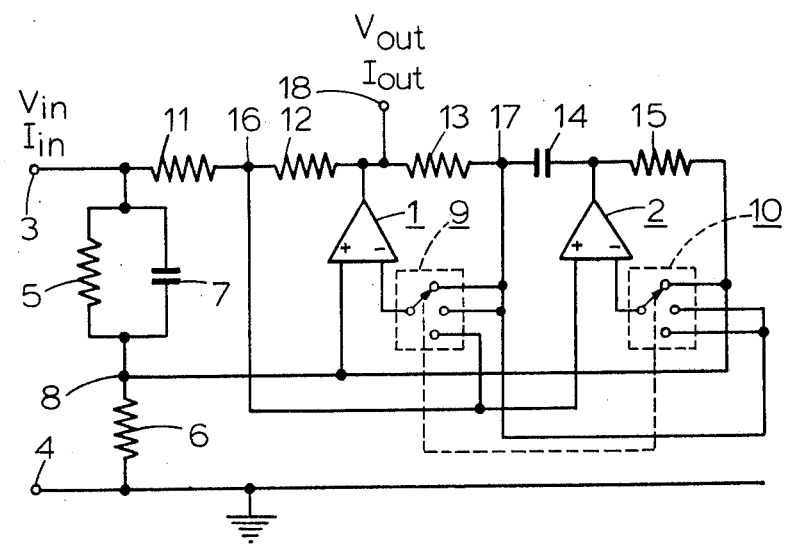

United States Patent [19]
Rollett

[11] 4,012,704
[45] Mar. 15, 1977

[54] ACTIVE AMPLITUDE EQUALIZERS

[75] Inventor: John Mortimer Rollett, London, England

[73] Assignee: The Post Office, London, England

[22] Filed: Mar. 22, 1976

[21] Appl. No.: 668,988

[30] Foreign Application Priority Data

Mar. 24, 1975 United Kingdom ............ 12269/75

[52] U.S. Cl. .......................... 333/28 R; 330/107; 333/80 R

[51] Int. Cl.[2] ...................... H03H 7/16; H03H 7/44

[58] Field of Search ......... 330/107, 109; 333/28 R, 333/80 R, 80 T

[56] References Cited

UNITED STATES PATENTS 3,936,777  2/1976  Rollett et al. .................... 333/80 R
3,940,709  2/1976  Heaslett ............................ 330/107

Primary Examiner—Paul L. Gensler
Attorney, Agent, or Firm—Kemon, Palmer & Estabrook

[57] ABSTRACT

This invention concerns gyrator circuits, and particularly gyrator circuits used in filters. The gyrator network contains two differential input operational amplifiers and an input network, some of the elements of which are variable to enable the Q, the bandwidth and the resonant frequency to be adjusted in such a way that previously adjusted parameters are not changed. The circuit may have three configurations according to the position of a pair of ganged switches, alternatively the switches may be replaced by fixed links.

7 Claims, 4 Drawing Figures

ACTIVE AMPLITUDE EQUALIZERS

In telecommunication systems it is often necessary to reduce the amplitude distortion of a transmission channel, so that the loss over the bandwidth of the channel is substantially constant, i.e. within prescribed variation limits. Networks which can be cascaded with a transmission channel to make the loss more or less constant are termed amplitude equalizers. Such equalizers have, in the past, been generally constructed with relatively bulky components such as coils and capacitors. More recently, ways have been sought to eliminate coils from electronic circuits, particularly in low frequency applications (say below 10 kHz) where they tend to be disproportionately large, heavy and expensive. Nowadays it is becoming common to use circuits containing only amplifiers, resistors and capacitors since such circuits can be small, light and can be realised in microelectronic form and can utilise thin film or thick film components. An object of the present invention is to provide a second order biquadratic amplitude equalizer. Such an equalizer may include differential input operational amplifiers, capacitors and resistors having characteristics, such as centre frequency, amplitude and Q-factor which can be designed or adjusted so as to provide amplitude shaping within a frequency range including audio frequencies.

Equalizers constructed according to the present invention may be used for
a. audio telecommunication channel equalization;
b. audio equalizaton for sound recording, reproduction or measurement, e.g. in the form of "graphic equalizers" which would require a bank of similar equalizers tuned to adjacent frequency bands; or
c. equalization of microphones for standard performances tests.

According to the present invention there is provided an active amplitude equalizer network having two differential input operational amplifiers each having an inverting input, a non-inverting input and an output, a first input terminal, a first output terminal and a reference terminal, a first, a scond, a third and a fourth junction point, said first junction point being connected to said input terminal by a first resistance and being connected to said reference terminal by a second resistance, said second junction point being connected to the input terminal by a third resistance and being connected to the output of the first differential amplifier by a fourth resistance, said third junction point being connected to the output of the first differential amplifier by a first pre-determinable resistance element and being connected to the output of the second differential amplifier by a first capacitance, said four junction point being connected to said junction point by a second pre-determinable resistance element and being connected to the output of the second differential amplifier by a fifth resistance, and a second capacitance connected between the fourth junction point and the first input terminal, wherein the non-inverting input of the first differential amplifier is connected to the fourth junction point, and the non-inverting input of the second differential amplifier is connected to the second junction point, and a first pole of a first selectable switch means is connected to the inverting input of the first differential amplifier, a first pole of a second selectable switch means is connected to the inverting input of the second differential amplifier, a second and a third pole of said first selectable switch means are connected to said third junction point, a fourth pole of said first selectable switch means is connected to said second junction point, a second pole of said second selectable switch means is connected to said fourth junction point and a third and a fourth pole of said second selectable switch means are connected to said third junction point, the arrangement being that said first and said second selectable switch means are ganged to operate in synchronism, the first pole of either switch being connectable at any one time to one only of the second, third and fourth poles of the same switch, the arrangement being further such that the first and second amplifier form part of a gyrator in a resonant circuit having a variable resonant frequency and which is connected to an input network consisting of said first and second resistances said second predeterminable resistance element and said second capacitance, the ratio of resistance of said first and said second resistance being selectable so as to control the attenuation at said resonant frequency and the Q-factor of the network, the output from said network being derived from the output of said first differential amplifier.

Figure 2:
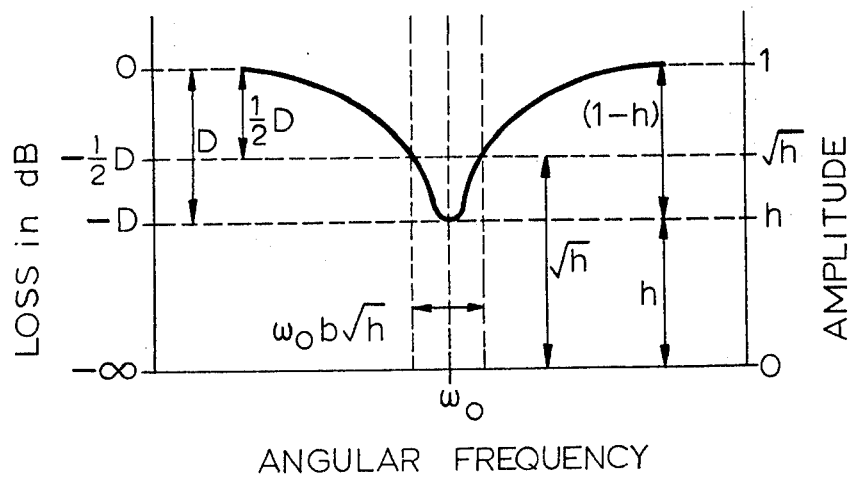
Figure 3:
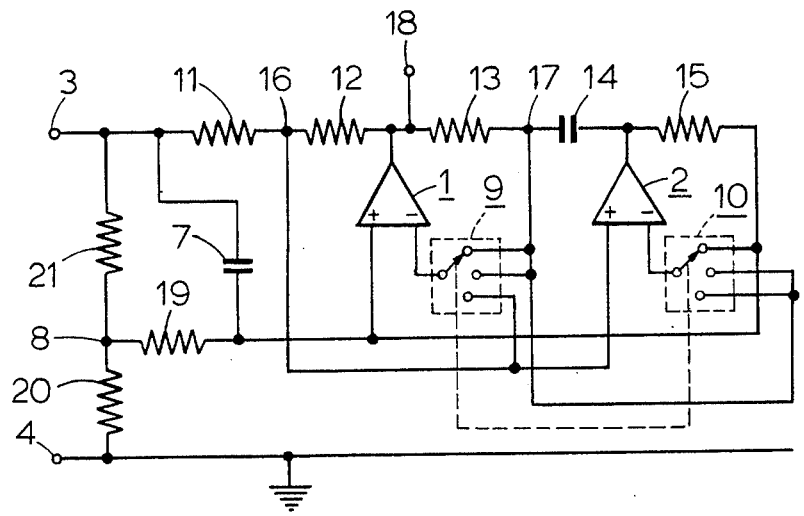
Figure 4:
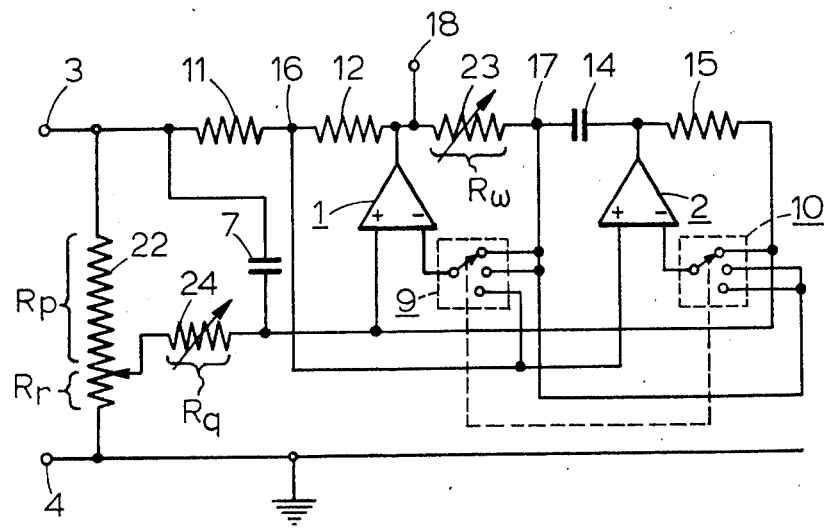

The invention will now be described by way of example, with reference to the accompanying diagrammatic drawing in which:

FIG. 1 shows the basic form of the circuit;
FIG. 2 illustrates graphically the shape of equalizer characteristic derived from a network according to the invention;
FIG. 3 shows a variation to the input network for the circuit of FIG. 1; and
FIG. 4 shows a further variation of the network according to the invention which permits manual adjustment of the circuit parameters.

Referring now to FIG. 1, the equalizer network comprises a first differential input operational amplifier 1 and a second differential input operational amplifier 2 each having an inverting input, a non-inverting input and an output interconnected by way of resistors and capacitors in a network which does not include any coils to provide inductance. The equalizer has an input network connected between an input terminal 3 and an earth reference terminal 4, said input network consisting of a resistor 5 and a resistor 6 in series between said terminals 3 and 4, and a capacitor 7 connected in parallel with the resistor 5. The junction point 8 between the resistors 5 and 6 is connected to the non-inverting input of the amplifier 1. The inverting input of the amplifier 1 is connected to a first selectable switch 9. the inverting input of the amplifier 2 is connected to a further selectable switch 10 which is ganged to said switch 9. The input terminal 3 is connected by way of a resistor 11 and a resistor 12 in series to the output of the amplifier 1. The output of the amplifier 1 is connected to the output of the amplifier 2 by way of a resistor 13 and a capacitor 14 in series. The output of the amplifier 2 is also connected to the junction point 8 by way of a resistor 15. The junction point 16 between the resistors 11 and 12 is directly connected to the non-inverting input of the amplifier 2 and selectably to the inverting input of the amplifier 1 by way of the switch 9. The junction point 17 between the resistor 13 and capacitor 14 is selectively coupled to the inverting input of the amplifiers 1 and 2 by way of the switches 9 and 10 respectively. The output from the equalizer network is derived from an output terminal 18 directly connected to the output of the amplifier 1. Considering now an analysis of the equalizer network and assuming that the amplifiers 1 and 2 have a very high input impedance, very low output impedance and a very high gain, then, for any position of the switches 9 and 10 an input signal $V_{in}$ and an output signal $V_{out}$ is related by the following equation $$\frac{V_{out}}{V_{in}} = \frac{G_{11} G_{13} G_{15} + sC_{14}(G_{12} G_5 - G_{11} G_6) + s^2 C_7 C_{14} G_{12}}{G_{11} G_{13} G_{15} + sC_{14}(G_{12}G_5 + G_{12} G_6) + s^2 C_7 C_{14} G_{12}} \quad (1)$$

where $s$ is the complex frequency variable,
$G_{11}$ denotes the conductance of the resistor 11,
$G_{12}$ denotes the conductance of the resistor 12, etc, and
$C_7$ denotes the capacitance of the capacitor 7,
$C_{14}$ denotes the capacitance of the capacitor 14.

The transfer function of second-order biquadratic amplitude equalizers may be expressed in general terms by the following expression:

$$T(s) = \frac{s^2 + hb\omega_o s + \omega_o^2}{s^2 + b\omega_o s + \omega_o^2} \quad (2)$$

where the resonance angular frequency is $\omega_o$,
the amplitude at the resonance frequency is $h$,
the Q-factor is $1/b$, and
the bandwidth is $\omega_o b \sqrt{h}$.

The bandwidth is illustrated in FIG. 2 on the graph showing the relationship between signal amplitude (loss on dB) and angular frequency. It will be seen that the bandwidth is defined as the difference in frequency at half the maximum loss produced at the resonant frequency of the equalizer network.

For some communication transmission channels it is possible to determine the parameters $\omega_o$, $h$ and $b$ for each of a set of equalizers which, when cascaded with the channel will provide the loss characteristic required. In order to design the equalizer sections it is necessary to relate the element values of the circuit with the parameters.

From equation (1) the parameters may be determined in terms of the resistances and capacitances of the circuit elements as follows:

$$\omega_o = \sqrt{\frac{G_{11} G_{13} G_{15}}{G_{12} C_7 C_{14}}} = \sqrt{\frac{(R_{12})}{(R_{11})} \frac{1}{R_{13} R_{15} C_7 C_{14}}} \quad (3)$$

$$h = \frac{G_{12} G_5 - G_{11} G_6}{G_{12} G_5 + G_{12} G_6} = \frac{R_6 - R_5 (R_{12}/R_{11})}{R_6 + R_5} \quad (4)$$

$$b = \frac{C_{14} G_{12} (G_6 + G_5)}{\sqrt{C_7 C_{14} G_{11} G_{12} G_{13} G_{15}}} = \sqrt{\frac{C_{14}}{C_7}} \sqrt{\frac{R_{11}}{R_{12}}} \frac{(R_6 + R_5)\sqrt{R_{13} R_{15}}}{R_6 R_5} \quad (5)$$

where the resistor 11 having a conductance $G_{11}$ has a resistance $R_{11}$ etc,
and the capacitor 14 has a capacitance $C_{14}$ as for equation 1. The equations (3) to (5) can be inverted to yield formulae for the circuit elements in terms of the parameters $\omega_o$, $h$ and $b$.

A possible set of formulae will now be developed. It will be noted in the equations (3) to (5) that the resistors 11 and 12 only appear as a ratio in terms of their resistances as $(R_{12}/R_{11})$. It is therefore convenient to choose the resistances of resistors 11 and 12 to be substantially equal, since the number of different values of resistance is then reduced which leads to a useful economy in construction. It will therefore be assumed (for convenience, not of necessity), that the resistance of resistor 11 is equal to the resistance of the resistor 12. For similar reasons it is more economical to assume that the capacitor 7 has the same capcitance as capacitor 14, and also that the resistances of the resistors 13 and 15 are equal. The values of these pairs of components will be denoted according to the following convention:

$$C_7 = C_{14} = C$$

and $$R_{13} = R_{15} = R$$

The equations (3) to (5) can now be re-written as:

$$\omega_o = \frac{1}{RC} \quad (6)$$

$$h = \frac{R_6 - R_5}{R_6 + R_5} \quad (7)$$

$$b = \frac{R (R_6 + R_5)}{R_6 R_5} \quad (8)$$

One possible set of formulae for the element values, corresponding to the arbitrary assumptions described above, is therefore:

$$R_{11} = R_{12} \quad (9)$$

$$R_{13} = R_{15} = R \quad (10)$$

$$C_7 = C_{14} = C = 1/\omega_o R \quad (11)$$

$$R_6 = 2R/b (1-h) \quad (12)$$

$$R_5 = 2R/b (1+h) \quad (13)$$

where $R$ must be chosen to have a value which leads to convenient values for the other elements; in addition $R_{11}$ and $R_{12}$ will be chosen to have convenient equal values. It should be noted that from equation (4) the value of $h$, the amplitude of the resonance frequency $\omega_o$, is always less than unity, and it will be appreciated from equation (1) that at low frequencies (where $s \to 0$) and at high frequencies (where $s \to \infty$) the amplitude tends to unity, so that the amplitude characteristic of the equalizer is always valley-shaped, with a minimum at the resonance frequency (as shown in FIG. 2). The "depth" of the valley is $1-h$, and it follows from equation (4) that:

$$1 - h = \frac{R_6 (R_{11} + R_{12})}{R_{11} (R_6 + R_5)} \quad (14)$$

In practice, in the construction of circuits in microelectronic form, it is not always easy to provide for one component to have a value exactly the same as another; and in addition, the effects of stray capacitances, tolerances on components and amplifier imperfections are all liable to cause the equalizer characteristic to depart from the desired characteristic. It is therefore desirable to be able to trim, or adjust the operation of the network after it has been constructed, either to achieve a predetermined characteristic, or to provide equalization on a trial-and-error basis.

Referring now to FIG. 3, a preferred modification of the basic circuit of FIG. 1 will now be described. The circuit of FIG. 3 allows separate adjustment of the resonance frequency, the resonance amplitude and the Q-factor, and therefore is useful in many practical applications. The operation of the circuit as analysed with reference to FIG. 1 is not affected by the modification to the circuit illustrated in FIG. 3. If a resistance of finite value is connected between the input terminal and earth to form a delta network it will be appreciated that this may be replaced by a star network as shown in which a resistor 19 is connected to the junction point 8. The circuit elements shown in FIG. 3 have been given the same reference numerals as corresonding elements in FIG. 1. However, the resistances of the input network of FIG. 3 are related to the resistances of resistors 19, 20 and 21 of the input network of FIG. 3 by the following formulae:

$$R_5 + P/R_{20}; \quad R_6 = P/R_{21} \quad (15)$$

were $$P = R_{19} R_{20} + R_{20} R_{21} + R_{21} R_{19} \quad (16)$$

the equation (3) for the resonance frequency therefore remains unaltered. The equation (4) for the resonance amplitude becomes:

$$h = \frac{R_{20} - R_{21} (R_{12}/R_{11})}{R_{20} + R_{21}} \quad (17)$$

and the "valley" depth equation (13) becomes:

$$1 - h = \frac{R_{21} (R_{11} + R_{12})}{R_{11} (R_{21} + R_{20})} \quad (18)$$

The equation (5) for the reciprocal of Q-factor becomes:

$$b = \sqrt{\frac{C_{14}}{C_7}} \sqrt{\frac{R_{11}}{R_{12}}} \sqrt{R_{13} R_{15}} \frac{(R_{21} + R_{20})}{(R_{19} R_{20} + R_{20} R_{21} + R_{21} R_{19})} \quad (19)$$

or $$b = \sqrt{\frac{C_{14}}{C_7}} \sqrt{\frac{R_{11}}{R_{12}}} \cdot \frac{\sqrt{R_{13} R_{15}}}{R_{19} + R_{21} R_{20}/(R_{21} + R_{20})} \quad (20)$$

The determining equations for the circuit of FIG. 3 are equations (3), (18) and (20). From these equations it can be seen that $\omega_o$ can be altered by adjusting any of the resistors 11, 12, 13 or 15 or the capacitors 7 or 14.

In low frequency circuits it is usually preferable to adjust resistors rather than capacitors, so it will be assumed that the capacitors 7 and 14 are not variable. One chosen feature of the circuit already analysed with reference to FIG. 1 was the value of the resistors 11 and 12 to be substantially equal, and this choice applies also to FIG. 3. Thus it is found that the resistor 13 or 15 may be used for altering $\omega_o$.

Consideration of equation (18) and (20) shows that $b$ is a function of the resistance of resistor 19, whereas the resistance $R_{19}$ does not enter into the equation of $(1-h)$. Hence by adjusting the resistance of $R_{19}$ of the resistor 19 the reciprocal of the Q-factor, $b$, can be altered without affecting $W_o$ or $h$. To alter the valley depth $(1-h)$, either the resistances $R_{20}$ or $R_{21}$ of the resistors 20 and 21 (or if ncessary the sum of the resistances $R_{20} + R_{21}$) can be adjusted. Because the valley depth is proportional to $R_{21}$ it is preferable to choose to adjust the resistance of the resistor 21. If a variable potentiometer is used to replace the resistors 20 and 21 the junction point 8 is provided by the slider of the variable potentiometer. In this case the sum of the resistances $R_{20} + R_{21}$ remains constant, and the depth of the valley is directly proportional to the fractional position of the potentiometer sliding contact forming the junction point 8. As previously stated adjustment of the resistance of the resistor 21 alters $b$, but this parameter can substantially be altered by adjusting the resistance of the resistor 19 which affects only $b$. A practical realisation of the circuit for manual adjustment of the parameters is shown in FIG. 4.

Referring now to FIG. 4 in which the components have been given the same reference numerals as corresponding elements in FIGS. 1 or 3, the network additionally includes a variable potentiometer 22 replacing the resistors 20 and 21 of FIG. 3, a variable resistor 23 replacing the resistor 13 of FIGS. 1 and 3 and a variable resistor 34 replacing the resistor 19 of FIG. 3. The slider of the variable potentiometer 22 forms the junction pont 8 so dividing the resistance $R_{22}$ into resistances $R_p$ and $R_p$ according to the following equation:

$$R_{22} = R_p + R_r \quad (21)$$

The resistance of the variable resistor 24 will be hereinafter referred to as $R_q$ when reference is made to it in general terms and $R_{24}$ when a specific preset value is referred to. The resistance of the variable resistor 23 will be referred to as $R_w$ in general terms and $R_{23}$ when a specific preset value is considered.

The trimming procedure for the circuit shown in FIG. 4 is as follows:

1. Adjust the resistance $R_w$ of the resistor 23 to set the resonance frequency $\omega_o$ (thereby also altering $b$, but not $h$);

2. Adjust the resistance $R_p$ of the variable potentiometer 22 to set the valley depth $(1-h)$ (which also affects $b$, but does not affect $\omega_o$);

3. Adjust the resistance $R_q$ of the variable resistor 24 to set the reciprocal Q-factor $b$ (without affecting $\omega_o$ or $h$).

In practice it may be necessary to repeat operation (1), and it is often necessary to repeat operations (2) and (3) alternately to achieve the loss characteristic required after setting the resonant frequency. If necessary the resistor 15 may be made a variable resistor in place of the variable resistor 23.

In microelectronic technology it is often only possible to increase the value of a resistance. In this case an alternative trimming procedure is preferable, as follows:

4. Increase the resistance $R_{12}$ of the resistor 12 to increase $\omega_o$, or increase the resistance of any one of resistors $R_{11}$, $R_{13}$, $R_{15}$ to decrease $\omega_o$;

5. Increase $R_p$ to increase $(1-h)$, or increase $R_r$ to reduce $(1-h)$;

6. Increase $R_q$ to increase the Q-factor; the initial Q-factor can be designed to lie below the required Q-factor for the worst-case spread of initial element values.

The order of trimming operations (1), (2), (3), or (4), (5), (6), is fortunately exactly the order in which one would choose to perform the operations when equalizing a typical channel loss characteristic. Thus the resonance frequency is set to a frequency of minimum loss, the depth is adjusted to make the loss more uniform and the bandwidth (or Q-factor) is adjusted to provide the widest range of uniform loss. More commonly, the resonance frequencies of a set of equalizers will be set to frequencies more or less evenly spaced through the channel band, and the depths and then the Q-factors adjusted appropriately to give a substantially equal-ripple loss characteristic.

If the resistance $R_q$ is arranged to be an order of magnitude greater than the magnitude of the resistance of the parallel combination $R_p$ and $R_r$, then the Q-factor becomes substantially proportional to $R_q$.

In practice the finite bandwidths of the amplifiers cause the equalizer characteristic to be slightly asymmetric; the asymmetry is greater the more the resonance frequency approaches the gain-bandwidth products of the amplifiers. Usually this distortion of the characteristic is unsufficient to be of consequence, but it can, if necessary be corrected in any of the following ways:

1. By connecting a large-valued resistor between the junction point 16 and the reference terminal 4;
2. By connecting a small-valued capacitance across any one of the resistors 11, 13 or 15.

The asymmetry may be over-compensated, i.e. made greater in the opposite sense, by using a smaller resistance (between junction 16 and terminal 4) or by using a larger capacitor. (Across any of resistors 11, 13 or 15). Alternatively, the asymmetry may be made more pronounced by connecting a capacitor from the junction point 16 to the reference terminal 4, or by connecting a capacitor across the resistor 12.

The impedances of the compensating components (or distorting components) would be generally an order of magnitude larger than the values of the components forming the basic equalizer network.

It will be seen that a particular advantage of the networks described is that a very high Q-factor is obtainable with low sensitivity. A Q of 100 is achievable, corresponding to a very small fractional bandwidth. Another advantage of the equalizer network is that circuit arrangements may be constructed with a range of frequencies of 5 : 1, a valley depth of 60dB, and a range of Q from 1 to 100.

What we claim is:

1. An active amplitude equalizer network having two differential input operational amplifiers each having a inverting input, a non-inverting input and an output, a first input terminal, a first output terminal and a reference terminal, a first, a second, a third and a fourth junction point, said first junction point being connected to said input terminal by a first resistance and being connected to said reference terminal by a second resistance, said second junction point being connected to the input terminal by a third resistance and being connected to the output of the first differential amplifier by a fourth resistance, said third junction point being connected to the output of the first differential amplifier by a first pre-determinable resistance element and being connected to the output of the second differential amplifier by a first capacitance, said fourth junction point being connected to said first junction pont by a second pre-determinable resistance element and being connected to the output of the second differential amplifier by a fifth resistance, and a second capacitance connected between the fourth junction point and the first input terminal, wherein the non-inverting input of the first differential amplifier is connected to the fourth junction point, and the non-inverting input of the second differential amplifier is connected to the second junction point, and a first pole of a first selectable switch means is connected to the inverting input of the first differential amplifier, a first pole of a second selectable switch means is connected to the inverting input of the second differential amplifier, a second and a third pole of said first selectable switch means are connected to said third junction point, a fourth pole of said first selectable switch means is connected to said second junction point, a second pole of said second selectable switch means is connected to said fourth junction point and a third and a fourth pole of said second selectable switch means are connected to said third junction point, the arrangement being that said first and said second selectable switch means are ganged to operate in synchronism the first pole of either switch being connectable at any one time to one only of the second, third and fourth poles of the same switch, the arrangement being further such that the first and second amplifier form part of a gyrator in a resonant circuit having a variable resonant frequency and which is connected to an input network consisting of said first and said second resistances said second pre-determinable resistance element and said second capacitance, the ratio of resistance of said first and said second resistance being selectable so as to control the attenuation at said resonant frequency and the Q-factor of the network, the output from said network being derived from the output of said first differential amplifier.

2. An active amplitude equalizer network as claimed in claim 1 wherein said first selectable switch means is positioned to connect the inverting input of the first amplifier to the third junction point and said second selectable switch means is positioned to connect the inverting input of the second amplifier to the fourth junction point.

3. An active amplitude equalizer network as claimed in claim 1 wherein said first selectable switch means is positioned to connect the inverting input of the first amplifier to the third junction point and said second selectable switch means is positioned to connect the inverting input of the second amplifier to the third junction point.

4. An active amplitude equalizer network as claimed in claim 1 wherein said first selectable switch means is positioned to connect the inverting input of the first amplifier to the second junction point and said second selectable switch means is positioned to connect the inverting input of the second amplifier to the third junction point.

5. An active amplitude equalizer network as claimed in claim 2 wherein said first and second resistances comprise a single potentiometer having a variable tapping point and where said first junction point is said tapping point.

6. An active amplitude equalizer network as claimed in claim 3 wherein said first and second resistances comprise a single potentiometer having a variable tapping point and where said first junction point is said tapping point.

7. An active amplitude equalizer network as claimed in claim 4 wherein said first and second rsistances comprise a single potentiometer havng a variable tapping point and where said first junction point is said tapping point.

* * * * *